(12) United States Patent
Lee et al.

(10) Patent No.: US 9,484,506 B2
(45) Date of Patent: Nov. 1, 2016

(54) LED DISPLAY AND MANUFACTURING METHOD THEREOF

(71) Applicant: Lextar Electronics Corporation, Hsinchu (TW)

(72) Inventors: Chia-En Lee, Chiayi (TW); Chia-Hung Hou, Miaoli County (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/959,026

(22) Filed: Dec. 4, 2015

(65) Prior Publication Data

US 2016/0087165 A1    Mar. 24, 2016

Related U.S. Application Data

(62) Division of application No. 14/219,035, filed on Mar. 19, 2014.

(30) Foreign Application Priority Data

Apr. 19, 2013    (TW) .............................. 102113992 A

(51) Int. Cl.
*H01L 33/00*    (2010.01)
*H01L 33/50*    (2010.01)
(Continued)

(52) U.S. Cl.
CPC ......... *H01L 33/504* (2013.01); *H01L 21/6835* (2013.01); *H01L 27/156* (2013.01);
(Continued)

(58) Field of Classification Search
CPC ..................... H01L 33/0079; H01L 27/156

USPC .......................................... 438/35
See application file for complete search history.

(56) References Cited

U.S. PATENT DOCUMENTS 6,212,213 B1    4/2001    Weber et al.
6,696,703 B2    2/2004    Mueller-Mach et al.
(Continued)

FOREIGN PATENT DOCUMENTS

CN         10159942 A      12/2009
JP         2013037138 A    2/2013
(Continued)

OTHER PUBLICATIONS

TW Office Action dated Aug. 12, 2014.
(Continued)

*Primary Examiner* — Mark Prenty
(74) *Attorney, Agent, or Firm* — McClure, Qualey & Rodack, LLP

(57) ABSTRACT

A manufacturing method of a LED display is provided. A temporary substrate is provided, wherein the temporary substrate has a first adhesive layer and a plurality of first, second and third LED chips mounted on the first adhesive layer. A first transparent substrate is provided, the transparent substrate has a plurality of pixels disposed thereon, and each of the pixels comprises a first sub-pixel, a second sub-pixel and a third sub-pixel respectively surrounded by a light-insulating structure. Then, the temporary substrate and the first transparent substrate are bonded together, such that each of the first, second and third LED chips is correspondingly mounted in each of the first sub-pixels, the second sub-pixels and the third sub-pixels. After that, the temporary substrate is removed. A LED display manufactured by said method is also provided.

12 Claims, 5 Drawing Sheets

(51) Int. Cl.
  *H01L 21/683* (2006.01)
  *H01L 27/15* (2006.01)
  *H01L 25/075* (2006.01)

(52) U.S. Cl.
  CPC ........ *H01L25/0753* (2013.01); *H01L 33/0079* (2013.01); *H01L 2221/68354* (2013.01); *H01L 2221/68368* (2013.01); *H01L 2221/68381* (2013.01); *H01L 2924/0002* (2013.01); *H01L 2933/0041* (2013.01)

(56) References Cited

U.S. PATENT DOCUMENTS

| | | | |
|---|---|---|---|
| 7,344,292 B2 | 3/2008 | Kim | |
| 7,745,241 B2 | 6/2010 | Chang | |
| 2012/0043552 A1* | 2/2012 | David | C09K 11/0883 257/76 |
| 2012/0223875 A1 | 9/2012 | Lau et al. | |
| 2013/0056765 A1* | 3/2013 | Thompson | H01L 27/15 257/88 |

FOREIGN PATENT DOCUMENTS

| | | |
|---|---|---|
| TW | I362533 | 4/2012 |
| WO | 2012136421 A1 | 10/2011 |
| WO | 2013039072 A1 | 3/2013 |

OTHER PUBLICATIONS

English Abstract translation of WO2013039072 (Published Mar. 21, 2013).

JP Office Action dated Apr. 7, 2015 in corresponding JP application (No. 2014514608).

* cited by examiner

LED DISPLAY AND MANUFACTURING METHOD THEREOF

This application is a divisional application of U.S. application Ser. No. 14/219,035, filed Mar. 19, 2014, which claims the benefit of Taiwan application Serial No. 102113992, filed Apr. 19, 2013. The entire contents of each of these applications are incorporated herein by reference.

BACKGROUND

1. Technical Field

The invention relates in general to a display and a manufacturing method thereof. More particularly, the invention relates to a light emitting diode (LED) display manufacturing method, and a LED display manufactured by said method and capable of emitting lights of multi-wavelengths.

2. Description of the Related Art

Flat-panel displays commonly seen comprise liquid crystal display (LCD) and organic light-emitting diode display (OLED).

Liquid crystal display is the mainstream product, the related technologies have been fully developed, and its price is low. However, the liquid crystal display requires an additional backlight module, making it difficult to further reduce the thickness or the weight.

OLED, which is self-luminous and does not require the backlight module, is lighter and thinner than LCD. However, the light emitting material of the OLED is expensive, the lifespan of OLED is relatively short, and the manufacturing process of the OLED is complicate. Therefore, the OLED still cannot replace the LCD and become widely used.

SUMMARY

The invention is directed to a LED display and a manufacturing method thereof. In the LED display manufacturing method according to this invention, LED chips are provided by a temporary substrate. As such, the LED display can be manufactured easily. Moreover, the LED display manufactured by said method has the advantages of lighter weight, smaller size, lower power consumption, higher contrast, higher response rate, lower cost, and longer lifespan.

According to one embodiment of the present invention, a manufacturing method of a LED display is disclosed. A temporary substrate is provided, wherein the temporary substrate has a first adhesive layer and a plurality of first, second and third LED chips mounted on the first adhesive layer. A first transparent substrate is provided, the first transparent substrate has a plurality of pixels disposed thereon, and each of the pixels comprises a first sub-pixel, a second sub-pixel and a third sub-pixel respectively surrounded by a light-insulating structure. Then, the temporary substrate is bonded to the first transparent substrate, such that each of the first, second and third LED chips is correspondingly mounted in each of the first sub-pixels, second sub-pixels and third sub-pixels. After that, the temporary substrate is removed.

According to another embodiment of the present invention, a LED display is disclosed. The LED display comprises a first transparent substrate, a plurality of pixels formed on the first transparent substrate, a packaging material filled into the pixels, and a second transparent substrate opposite and parallel to the first transparent substrate. Each of the pixels comprises a first sub-pixel, a second sub-pixel, a third sub-pixel, a first wavelength transition layer, a second wavelength transition layer, a third wavelength transition layer, an adhesive layer, a first LED chip, a second LED chip and a third LED chip. The first, second and third sub-pixels are respectively surrounding by a light-insulating structure. The first, the second and the third wavelength transition layers are formed in the first, second and third sub-pixels, respectively. The adhesive layer is disposed on the first, second and third wavelength transition layers. The first, second and third LED chips are disposed on the adhesive layer in the first, second and third sub-pixels, respectively. The packaging material is filled into the first sub-pixels, second sub-pixels and third sub-pixels of each of the pixels and. The second transparent substrate is bonded to the first, second and third LED chips by the packaging material.

Figure 1A:
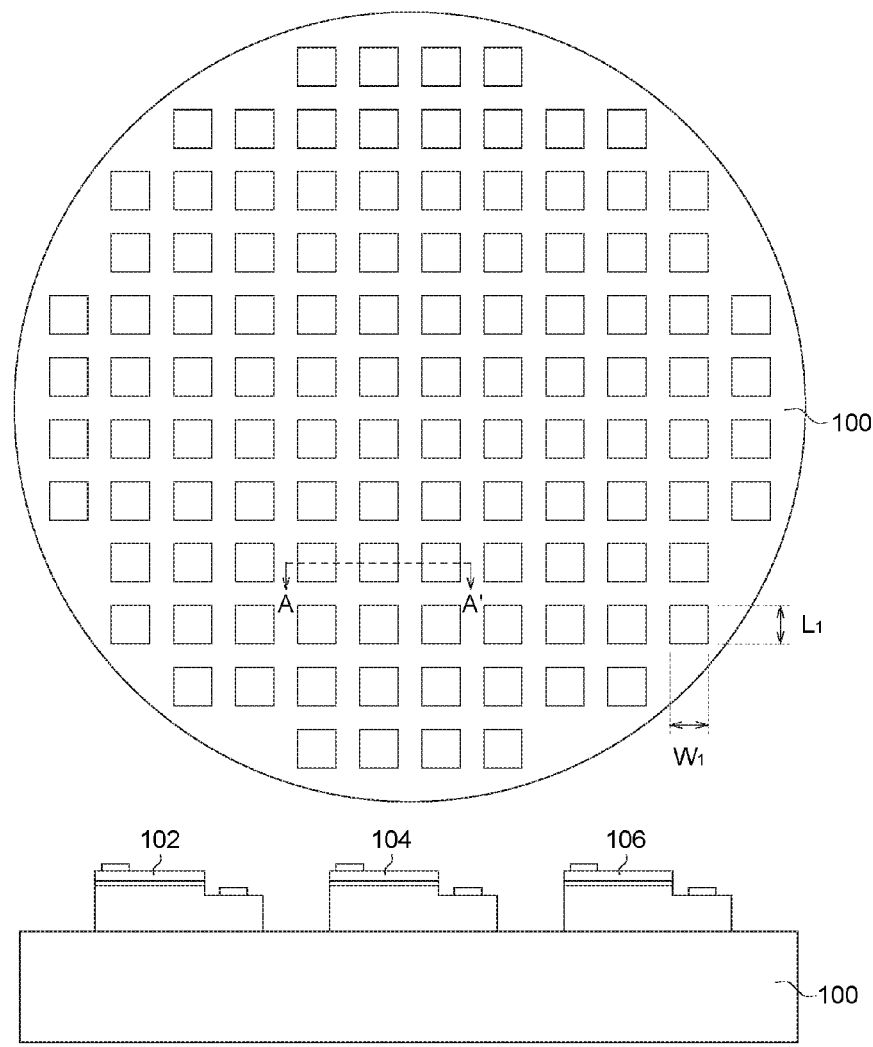
FIGS. 1A-1H schematically show a manufacturing method of a LED display according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIGS. 1A-1H, a manufacturing method of a LED display according to one embodiment of the invention are schematically shown. For clarity, sizes and relative dimensions of elements in the figures may not be illustrated according to their real sizes and relative dimensions, and some elements and reference numerals may be omitted in some diagrams.

FIG. 1A shows a top view of a substrate with a plurality of LEDs epitaxially formed thereon and a cross-sectional view along a cross-sectional line A-A'. As shown in FIG. 1A, a substrate (such as a sapphire substrate) 100 has a plurality of LED chips formed thereon. The LED chips comprise a first LED chip 102, a second LED chip 104 and a third LED chip 106. The first, second and third LED chips 102, 104 and 106 are substantially the same, however, the invention is not limited thereto. In one embodiment, a length L1 and a width W1 of each of the first, the second and the third LED chips 102, 104 and 106 are less than or equal to 60 μm. The first, second and third LED chips 102, 104 and 106 emit a light with wavelength of 365 to 480 nm. In other words, the first, second and third LED chips 102, 104 and 106 may be ultra-velvet (UV) LED chips or blue light LED chips.

Figure 1B:
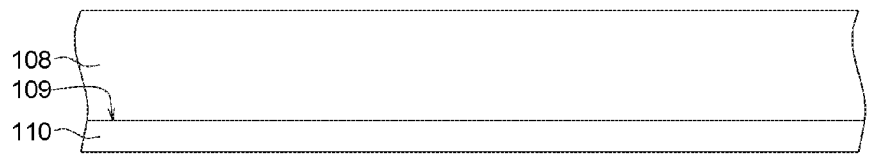
Figure 1C:
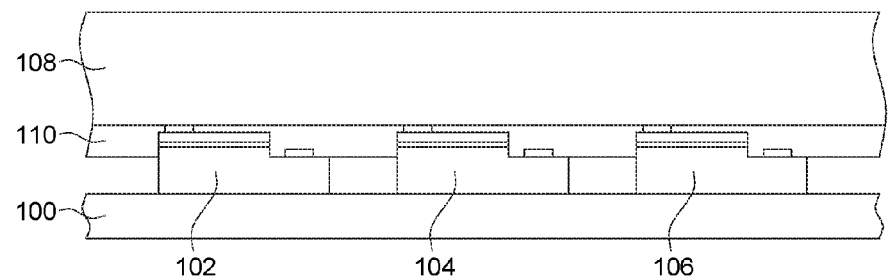

As shown in FIG. 1B, a temporary substrate 108 is provided. The temporary substrate 108 has a first adhesive layer 110 disposed on a surface 109 thereof. The temporary substrate 108 may be, for example, a plastic substrate, a glass substrate, a silicon substrate or a sapphire substrate. The first adhesive layer 110 may be an adhesive, an adhesive tape or a photosensitive adhesive tape.

Then, as shown in FIG. 1O, the structures shown in FIGS. 1A and 1B are bonded together, such that the first, second and third LED chips 102, 104 and 106 are mounted onto the first adhesive layer 110.

Figure 1D:
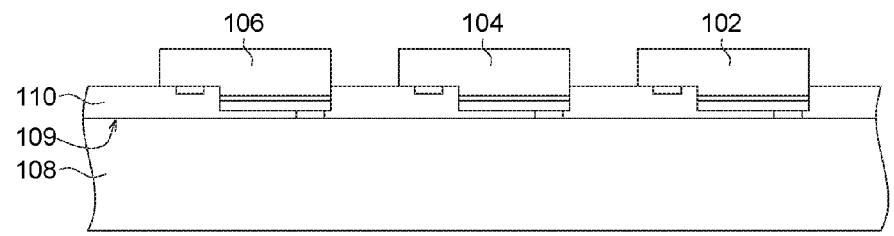

After that, as shown in FIG. 1D, the substrate 100 is removed. The left temporary substrate 108 has, on the surface 109, the first adhesive layer 110 and the first, second and third LED chips 102, 104 and 106 mounted on the first adhesive layer 110.

Figure 1E:
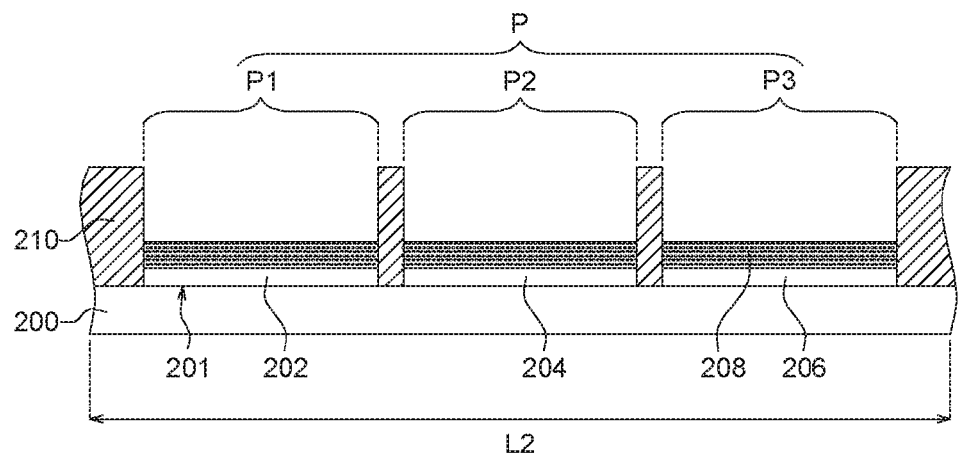

As shown in FIG. 1E, a first transparent substrate 200 is provided. The first transparent substrate 200, which may be a plastic substrate or a glass substrate, is used as a light emitting substrate of the LED display. The first transparent substrate 200 has a plurality of pixels P (only one pixel is illustrated) formed on a surface 201 thereof. Each of the pixels P comprises a first sub-pixel P1, a second sub-pixel P2 and a third sub-pixel P3. In one embodiment, a length L2 and a width W2 of each pixel P (illustrated in FIG. 2A) are less than or equal to 200 μm.

Here, a first wavelength transition material, a second wavelength transition material and a third wavelength transition material may be coated in each of the first, second and third sub-pixels P1, P2 and P3, so as to form a first wavelength transition layer 202, a second wavelength transition layer 204 and a third wavelength transition layer 206 in each of the first, second and third sub-pixels P1, P2 and P3, respectively. The first, second and third wavelength transition materials may be chosen depending on the first, second and third LED chips 102, 104 and 106 being used. For example, if the first, second and third LED chips 102, 104 and 106 are UV LED chips, then the first, second and third wavelength transition layers 202, 204 and 206 may be fluorescent layers which can be excited by a UV light to emit a red light, a green light and a blue light, respectively.

Then, a second adhesive layer 208 may be coated on the first, second and third wavelength transition layers 202, 204 and 206 in the first, second and third sub-pixels P1, P2 and P3, such that the first, second and third LED chips 102, 104 and 106 can be respectively mounted on the first, second and third wavelength transition layers 202, 204 and 206 by the second adhesive layer 208 in subsequent steps. The second adhesive layer 208 may be formed using a light curing material or a heat curing material, such as silicone.

In addition, a light-insulating structure 210 is formed on a surface 201 of the first transparent substrate 200. The light-insulating structure 210 surrounds the first, second and third sub-pixels P1, P2 and P3, and is used to define the boundary of the first, second and third sub-pixels P1, P2 and P3 and shield the light. The first wavelength transition layer 202 and the second adhesive layer 208 disposed thereon are formed in the first sub-pixels P1, the second wavelength transition layer 204 and the second adhesive layer 208 disposed thereon are formed in the second sub-pixels P2, and the third wavelength transition layer 206 and the second adhesive layer 208 disposed thereon are formed in the third sub-pixels P3.

Figure 1F:
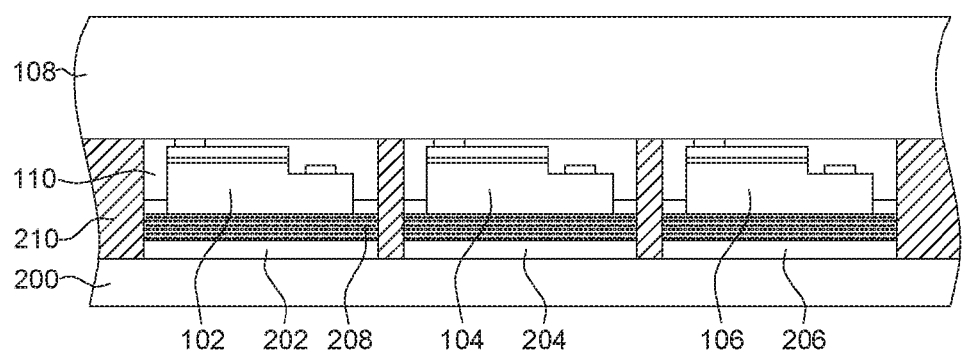

After that, as shown in FIG. 1F, the structures shown in FIGS. 1D and 1E are bonded together. The temporary substrate 108 is bonded to the first transparent substrate 200, such that the first, second and third LED chips 102, 104 and 106 are correspondingly mounted in the first, second and third sub-pixels P1, P2 and P3, respectively.

Here, the first, second and third LED chips 102, 104 and 106 are respectively mounted in the first, second and third sub-pixels P1, P2 and P3 by the second adhesive layer 208. For example, in a condition that the second adhesive layer 208 is formed from a light curing material, a step of curing the second adhesive layer 208 can be performed by a light curing process. While in a condition that the second adhesive layer 208 is formed from a heat curing material, the step of curing the second adhesive layer 208 can be performed by a heat curing process.

Figure 1G:
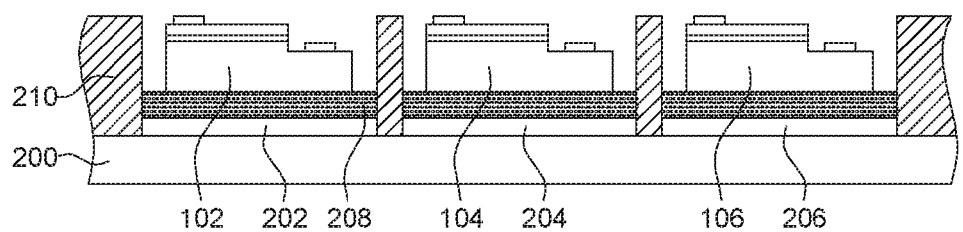

As shown in FIG. 1G, the temporary substrate 108 is removed, and the first adhesive layer 110 is also removed.

The step of removing the first adhesive layer 110 may be performed after the step of removing the temporary substrate 108. For example, in a condition that the first adhesive layer 110 is an adhesive (such as a hot melt adhesive), when the temporary substrate 108 is removed, the first adhesive layer 110 is exposed, and the first adhesive layer 110 may be removed by a hot melting process or a laser ablation process.

Alternatively, the step of removing the first adhesive layer 110 and the step of removing the temporary substrate 108 may be performed at the same time. For example, in a condition that the first adhesive layer 110 is an adhesive tape which can be directly peeled off, the first adhesive layer 110 can be peeled off and removed from the first, second and third LED chips 102, 104 and 106 when the temporary substrate 108 is removed. In another example, in a condition that the first adhesive layer 110 is a photosensitive adhesive tape which can be peeled off after having been cured by an UV-light, the first adhesive layer 110 can be cured by a UV light to reduce the viscosity of the first adhesive layer 110, and then the step of removing the temporary substrate 108 and the step of peeling the first adhesive layer 110 off the first, second and third LED chips 102, 104 and 106 can be performed at the same time.

Here, the first adhesive layer 110 and the second adhesive layer 208 are formed from different materials. As such, the second adhesive layer 208 mounting the first, second and third LED chips 102, 104 and 106 on the first transparent substrate 200 will not be damaged by the removal of the first adhesive layer 110.

Figure 1H:
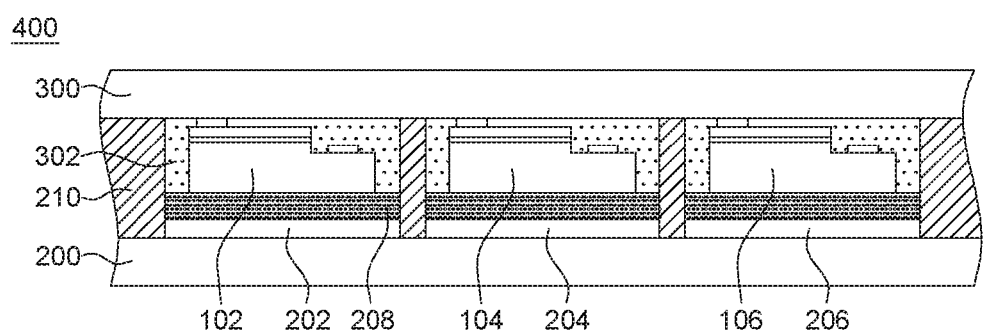

After that, as shown in FIG. 1H, a second transparent substrate 300 and a packaging material 302 are provided.

The second transparent substrate 300 may be, for example, a plastic substrate or a glass substrate. Moreover, a circuit structure of LED display, such as a scanning circuit or a driving circuit, can be pre-formed on the second transparent substrate 300.

The packaging material 302 is filled into each of the first, the second and the third sub-pixels P1, P2 and P3 and is used to bond the first, second and third LED chips 102, 104 and 106 to the second transparent substrate 300. The packaging material 302 may be silicone or epoxy resin. The packaging material 302 fills up the remaining space of the first, second and third sub-pixels P1, P2 and P3, thus can protect the first, second and third LED chips 102, 104 and 106.

Structure and manufacturing method of a LED display 400 have been disclosed above.

According to the disclosed manufacturing method of a LED display, the LED chips formed on the substrate 100 are transferred to the temporary substrate 108 at first, and then the first, second and third LED chips 102, 104 and 106 are provided to each of the first, second and third sub-pixels P1, P2 and P3 of the LED display 400 through the temporary substrate 108. As such, the manufacturing time is reduced, and the manufacturing efficiency is increased.

In addition, since the substrate 100 (such as a sapphire substrate) does not need to be cut, the LED chips will not be subjected to the restriction that the length and the width of a LED chip cannot be reduced to be less than 200 μm due to the hardness of the substrate 100. Thus, the length L1 and the width W1 of each of the first, second and third LED chips 102, 104 and 106 can be reduced to be less than or equal to 60 μm, and the length L2 and the width W2 of each pixel P can be less than or equal to 200 μm, being conformed to the requirement of a display.

Figure 2A:
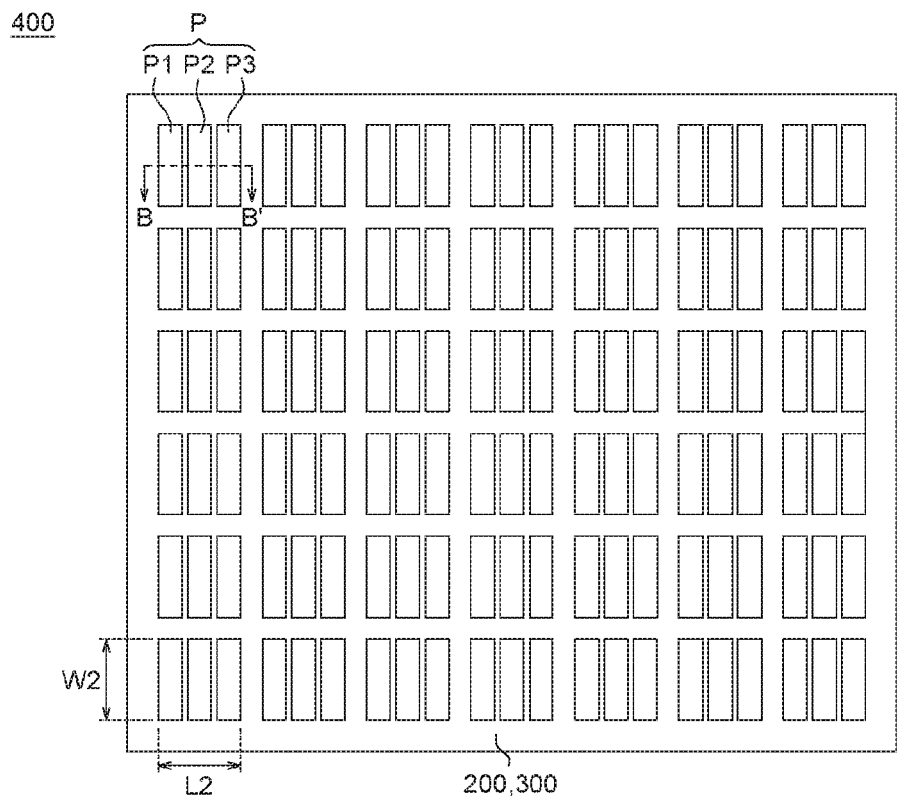
FIGS. 2A-2B schematically show a LED display according to one embodiment of the invention.
Figure 2B:
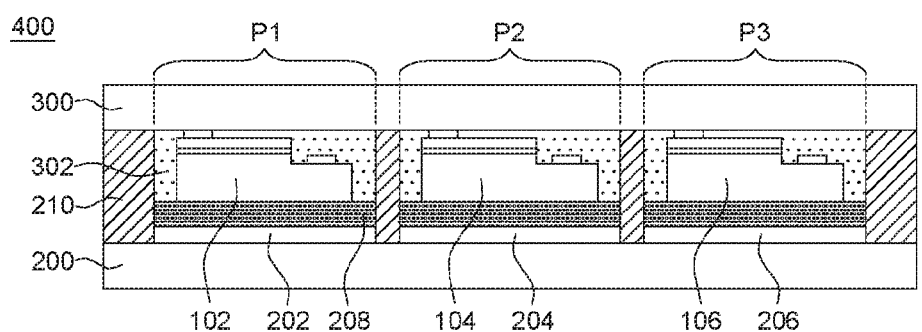

Referring to FIGS. 2A-2B, a LED display according to one embodiment of the invention are schematically shown. FIGS. 2A-2B illustrate a LED display 400 manufactured by said manufacturing method. FIG. 2A is a schematic diagram of the LED display 400. FIG. 2B shows a cross-sectional view along a cross-sectional line B-B' of FIG. 2A. To clearly illustrate the features of this invention, sizes and relative dimensions of elements in the figures may not be illustrated according to their real sizes and relative dimensions, and some elements and reference numerals may be omitted in some diagrams.

The LED display 400 comprises a first transparent substrate 200 and a second transparent substrate 300 parallel and opposite to each other, a plurality of pixels P and a packaging material 302. The first transparent substrate 200 may be a glass substrate or a plastic substrate. The light emitted by the LED display 400 goes out through the first transparent substrate 200. The second transparent substrate 300 may be a glass substrate or a plastic substrate.

The pixels P are formed on the first transparent substrate 200 each with a length L2 and a width W2 less than or equal to 200 μm. Each pixel P comprises a first sub-pixel P1, a second sub-pixel P2 and a third sub-pixel P3 respectively surrounded by a light-insulating structure 210. Each pixel P further comprises a first wavelength transition layer 202, a second wavelength transition layer 204, a third wavelength transition layer 206, an adhesive layer 208, a first LED chips 102, a second LED chips 104 and a third LED chips106. The first wavelength transition layer 202 is formed in the first sub-pixels P1. The second wavelength transition layer 204 is formed in the second sub-pixels P2. The third wavelength transition layer 206 is formed in the third sub-pixels P3. The adhesive layer 208 is formed on the first, the second and the third wavelength transition layers 202, 204 and 206 from a material comprising a light curing material or a heat curing material, such as silicone. The first LED chip 102 is mounted on the adhesive layer 208 in the first sub-pixel P1. The second LED chip 104 is mounted on the adhesive layer 208 in the second sub-pixel P2. The third LED chip 106 is mounted on the adhesive layer 208 in the third sub-pixel P3. The first, second and third LED chips 102, 104 and 106 may be UV LED chips or blue light LED chips each with a length L1 (illustrated in FIG. 1A) and a width W1 (illustrated in FIG. 1A) being less than or equal to 60 μm. When the first, second and third LED chips 102, 104 and 106 are UV LED chips, the first, second and third wavelength transition layers 202, 204 and 206 may be fluorescent layers which can be excited by a UV light to emit a red light, a blue light and a green light, respectively.

The packaging material 302 is filled into each of the first, second and third sub-pixels P1, P2 and P3. The packaging material 302, such as silicone or epoxy resin, enables the second transparent substrate 300 to be bonded to the first, second and third LED chips 102, 104 and 106. The packaging material 302 fills up the remaining space of the first, second and third sub-pixels P1, P2 and P3 to protect the first, second and third LED chips 102, 104 and 106.

The LED display 400, being self-luminous by the first, second and third LED chips 102, 104 and 106, does not require any extra backlight source, and therefore is lightweight and slim.

In addition, when the light emitted by the first, second and third LED chips 102, 104 and 106 passes through the first, second and third wavelength transition layers 202, 204 and 206, the light is converted to lights of multi-wavelengths. The first, second and third wavelength transition layers 202, 204 and 206 are fluorescent layers, which provide higher contrast than generally known color filters.

Besides, the LED display 400 uses LEDs as light source. Compared to OLED, LED has the advantages of higher efficiency, higher response rate, lower cost and longer lifespan. Therefore, the LED display 400 using LEDs as light source has these advantages of higher efficiency, higher response rate, lower cost and longer lifespan.

In the LED display manufacturing method according to this invention, LED chips are provided by a temporary substrate. Thus, the LED display can be manufactured easily. Further, the LED display manufactured by said manufacturing method has the advantages of higher efficiency, higher response rate, lower cost and longer lifespan. The LED display according to this invention can be applied to flat-panel display of any size, such as 6-8 inch flat-panel displays. However, the invention is not limited thereto.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A manufacturing method of a light emitting diode (LED) display, comprising:
   providing a temporary substrate having a first adhesive layer and a plurality of first, second and third LED chips mounted on the first adhesive layer;
   providing a first transparent substrate having a plurality of pixels disposed thereon, wherein each of the pixels comprises a first sub-pixel, a second sub-pixel and a third sub-pixel respectively surrounded by a light-insulating structure;
   bonding the temporary substrate to the first transparent substrate, such that each of the first, second and third LED chips is correspondingly mounted in each of the first sub-pixels, second sub-pixels and third sub-pixels; and
   removing the temporary substrate.

2. The manufacturing method according to claim 1, wherein after the step of removing the temporary substrate, the method further comprises a step of removing the first adhesive layer.

3. The manufacturing method according to claim 2, wherein the first adhesive layer is an adhesive, and the step of removing the first adhesive layer is performed by a hot melting or a laser ablation process.

4. The manufacturing method according to claim 1, wherein the first adhesive layer is an adhesive tape which can be directly peeled off or a photosensitive adhesive tape which can be peeled off after having been cured by an UV light.

5. The manufacturing method according to claim 1, wherein before the step of bonding the temporary substrate to the first transparent substrate, the method further comprises a step of coating a first wavelength transition material, a second wavelength transition material and a third wavelength transition material in each of the first sub-pixels, second sub-pixels and third sub-pixels, respectively, to form a first wavelength transition layer, a second wavelength transition layer and a third wavelength transition layer in each of the first sub-pixels, the second sub-pixels and the third sub-pixels, respectively.

6. The manufacturing method according to claim 5, wherein after the step of coating the first, the second and the third wavelength transition materials in each of the first sub-pixels, second sub-pixels and third sub-pixels, the method further comprises a step of coating a second adhesive layer on the first, second and third wavelength transition layers in each of the first sub-pixels, second sub-pixels and third sub-pixels, such that each of the first, second and third LED chips can respectively be mounted on each of the first, second and third wavelength transition layers by the second adhesive layer.

7. The manufacturing method according to claim 6, wherein the step of mounting the plurality of first, second and third LED chips by the second adhesive layer comprises curing the second adhesive layer.

8. The manufacturing method according to claim 7, wherein the step of curing the second adhesive layer is performed by a light curing process or a heat curing process.

9. The manufacturing method according to claim 1, wherein the first, second and third LED chips are ultra-velvet (UV) LED chips.

10. The manufacturing method according to claim 9, wherein the first, second and third wavelength transition layers are fluorescent layers which can be excited by a UV light to emit a red light, a green light and a blue light, respectively.

11. The manufacturing method according to claim 1, wherein the first, second and third LED chips are blue light LED chips.

12. The manufacturing method according to claim 2, wherein after the step of removing the first adhesive layer, the method further comprises:
 providing a second transparent substrate; and
 providing a packaging material filled into each of the first sub-pixels, second sub-pixels and third sub-pixels for bonding the plurality of first, second and third LED chips to the second transparent substrate.

* * * * *